(12) United States Patent
Wu et al.

(10) Patent No.: US 8,237,207 B2
(45) Date of Patent: Aug. 7, 2012

(54) BACK SIDE ILLUMINATION IMAGE SENSOR AND A PROCESS THEREOF (75) Inventors: Yang Wu, Tainan (TW); Chi-Shao Lin, Tainan (TW)

(73) Assignee: Himax Imaging, Inc., Grand Cayman (KY)

( * ) Notice: Subject to any disclaimer, the term of this patent is extended or adjusted under 35 U.S.C. 154(b) by 165 days.

(21) Appl. No.: 12/795,256

(22) Filed: Jun. 7, 2010

(65) Prior Publication Data
US 2011/0169055 A1 Jul. 14, 2011

Related U.S. Application Data (60) Provisional application No. 61/294,398, filed on Jan. 12, 2010.

(51) Int. Cl.
*H01L 31/062* (2006.01)

(52) U.S. Cl. ......... 257/292; 257/291; 257/293; 257/294
(58) Field of Classification Search .................. 257/291, 257/292, 293, 294
See application file for complete search history.

(56) References Cited

U.S. PATENT DOCUMENTS

| 7,348,613 | B2 * | 3/2008 | Rhodes | 257/292 |
| 2008/0081393 | A1 * | 4/2008 | Park et al. | 438/59 |
| 2009/0166690 | A1 * | 7/2009 | Kim | 257/292 |

* cited by examiner

*Primary Examiner* — Tan N Tran
(74) *Attorney, Agent, or Firm* — Stout, Uxa, Buyan & Mullins, LLP (57) ABSTRACT A process and structure of a back side illumination (BSI) image sensor are disclosed. An n-type doped region is formed in a substrate, and a transfer gate is formed on top of the semiconductor substrate. A p-type doped region is formed in the n-type doped region either using the transfer gate as a mask or is non-self aligned formed.

12 Claims, 7 Drawing Sheets non-SA FSI

FIG. 1A
(PRIOR ART)

non-SA FSI

FIG. 1B
(PRIOR ART)

SA FSI

FIG. 7

# BACK SIDE ILLUMINATION IMAGE SENSOR AND A PROCESS THEREOF

CROSS-REFERENCE TO RELATED APPLICATIONS

This application claims the benefit of U.S. Provisional Application No. 61/294,398, filed Jan. 12, 2010 and entitled NON-SELF ALIGNED BACK SIDE ILLUMINATION (BSI) CMOS IMAGE SENSOR WITH AN EXTENDED TRANSFER GATE POLY, the entire contents of which are hereby incorporated by reference.

BACKGROUND OF THE INVENTION

1. Field of the Invention

The present invention generally relates to an image sensor, and more particularly to a process and structure of a non-self aligned back side illumination (BSI) CMOS image sensor.

2. Description of Related Art

Figure 1A:
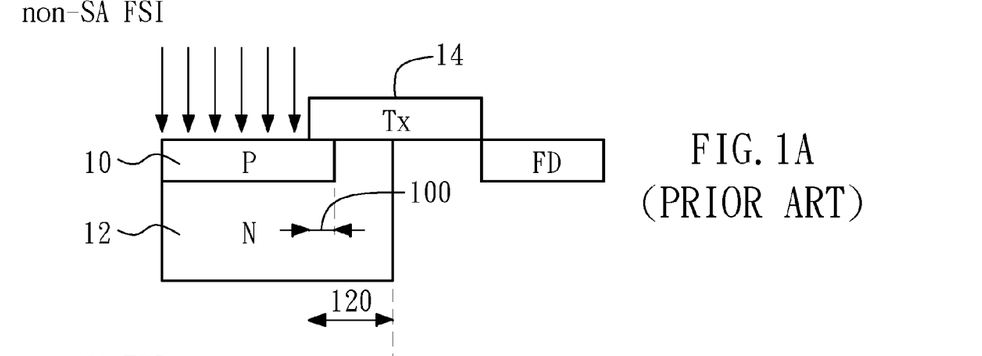
FIG. 1A shows a cross sectional view of a conventional photodiode along with a portion of a pixel circuit of a non-self aligned (non-SA) front side illumination (FSI) CMOS image sensor (CIS)
Figure 1B:
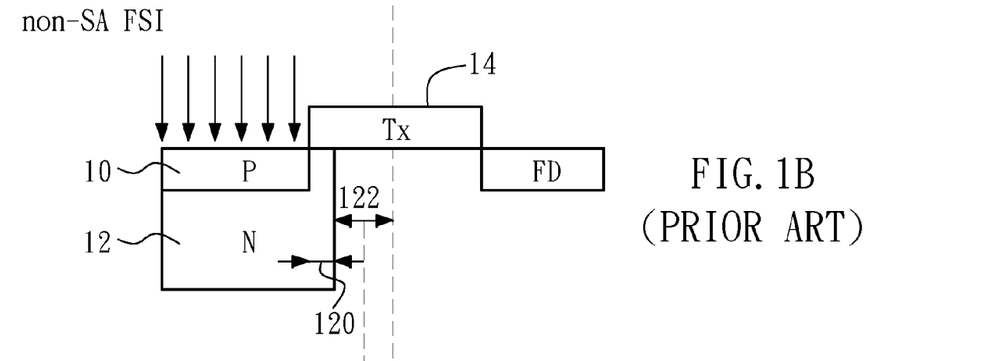
FIG. 1B exemplifies a conventional non-SA FSI CIS with narrow overlap due to misalignment.

The pixel size of a complementary metal oxide semiconductor (CMOS) image sensor (CIS) becomes smaller than ever to meet high resolution and low form factor (or physical dimensions) requirement, for example, for mobile devices. FIG. 1A shows a cross sectional view of a conventional photodiode along with a portion of a pixel circuit. The front side of silicon wafer receives light, and this type of CIS is commonly called the front side illumination (FSI) CIS. As the p-type implant 10 and the n-type implant 12 of the photodiode are masked defined, this type of FSI CIS is thus called the non-self aligned (non-SA) FSI CIS. One of the disadvantages of the non-SA FSI CIS is the overlap issue, in which the first overlap 100 between the p-type implant 10 and the transfer gate (Tx) 14 and the second overlap 120 between the n-type implant 12 and the transfer gate 14 cannot be precisely controlled. Specifically, the first overlap 100 provides low leakage dark current when the transfer gate 14 is off, and the second overlap 120 provides smooth charge transfer when the transfer gate 14 is on. FIG. 1B exemplifies a non-SA FSI CIS with narrow second overlap 120 due to misalignment 122. Accordingly, the performance of the pixels in the non-SA FSI CIS varies tremendously from column to column, wafer to wafer, and lot to lot.

Figure 1C:
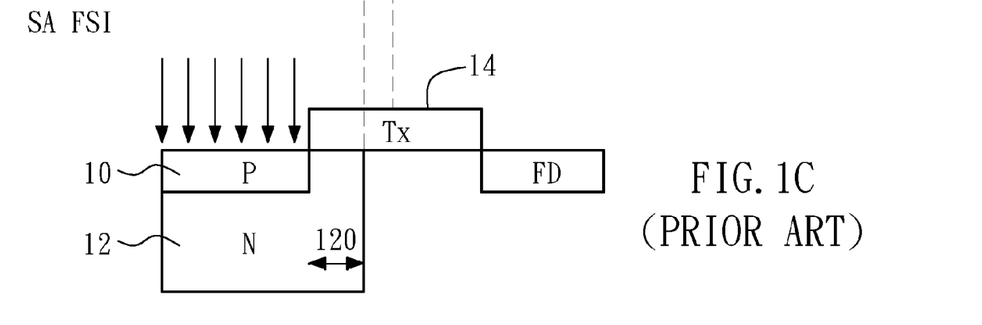
FIG. 1C shows a cross sectional view of a conventional self-aligned (SA) FSI CIS.

FIG. 1C shows a cross sectional view of another conventional FSI CIS. The p-type implant 10 and the n-type implant 12 are aligned with the transfer gate 14, which is used as a mask, and this type of FSI CIS is thus called the self aligned (SA) FSI CIS. Compared to the non-SA FSI CIS (FIG. 1A), the SA FSI CIS may achieve consistent performance. However, it is difficult to have a large margin on the second overlap 120 between the n-type implant 12 and the transfer gate 14 due to some design constrains such as the photodiode depth, shape, blue response or transfer gate height. Accordingly, the tiny second overlap 120 may be easily affected by other implants, particularly when the pixel size is very small, thereby complicating the process optimization.

Figure 2A:
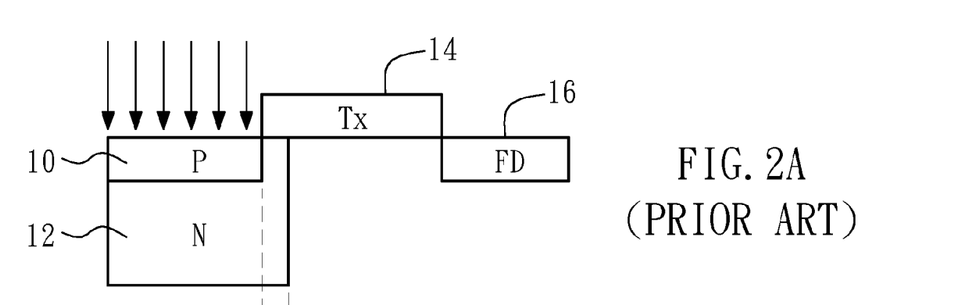
FIG. 2A shows a cross sectional view of a conventional FSI CIS before applying the conventional schemes.

In order to solve the overlap issue discussed above, there are some schemes disclosed to make the second overlap 120 between the n-type implant 12 and the transfer gate 14 sufficiently large so that the overlap variation becomes relatively small or/and the performance of the transfer gate 14 does not change due to overlap variation. FIG. 2A shows a cross sectional view of a conventional FSI CIS before applying the schemes, FIG. 2B shows a cross sectional view of a FSI CIS after applying the first scheme, and FIG. 2C shows a cross sectional view of a FSI CIS after applying the second scheme.

Figure 2B:
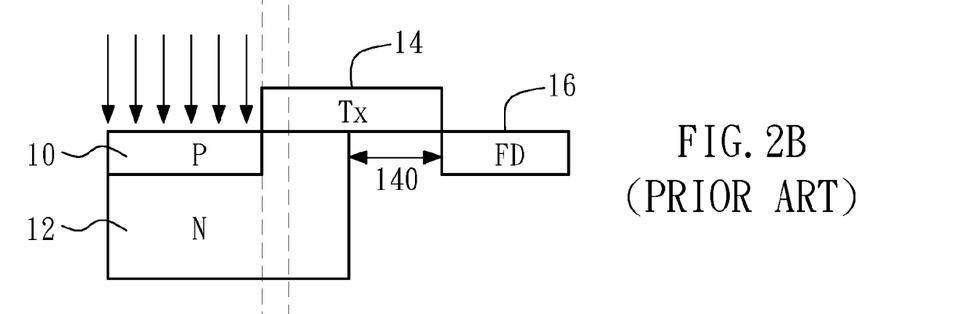
FIG. 2B shows a cross sectional view of a FSI CIS after applying the first conventional scheme.

In the first scheme, as shown in FIG. 2B which is to be compared to FIG. 2A, the transfer gate 14 is kept unchanged, but the edge of the n-type implant 12 is extended into the transfer gate 14 area toward the floating diffusion (FD) 16. However, according to this scheme, the effective transfer gate length 140 becomes shorter, thereby increasing leakage current or even resulting in punch through between the n-type implant 12 and the floating diffusion 16.

Figure 2C:
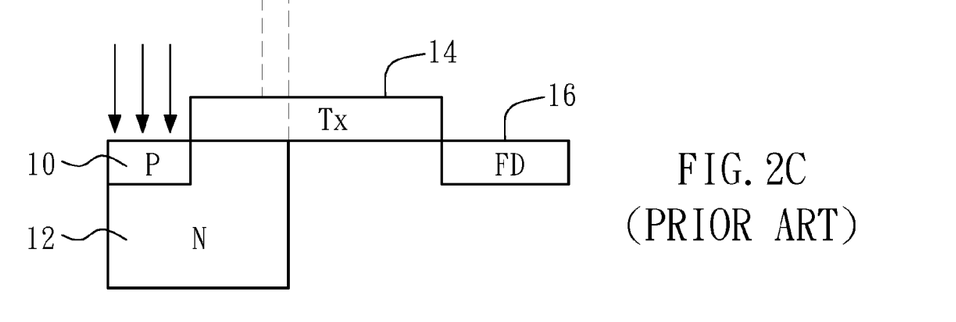
FIG. 2C shows a cross sectional view of a FSI CIS after applying the second conventional scheme.

In the second scheme, as shown in FIG. 2C which is to be compared to FIG. 2A, the n-type implant 12 is kept unchanged, but the edge of the transfer gate 14 is extended toward the photodiode (i.e., the p-type implant 10 and the n-type implant 12). However, according to this scheme, the effective area (or optical fill factor) for receiving incoming light becomes smaller, thereby degrading quantum efficiency (QE).

For the reason that conventional CIS, either non-SA FSI CIS or SA FSI CIS, could not effectively solve the overlap issue, a need has arisen to propose a novel CIS that has better performance than the conventional CIS.

SUMMARY OF THE INVENTION

In view of the foregoing, it is an object of the embodiment of the present invention to provide a process and structure of a non-SA back side illumination (BSI) CMOS image sensor (CIS) that may increase the overlap between the n-type implant and the transfer gate. In one embodiment, an extended transfer gate is formed to improve hole accumulation with off transfer gate, thereby reducing surface dark current. Moreover, if non-SA BSI CIS is applied to the advanced three dimensional (3D) CIS structure, the coupling capacitance between a transfer-gate via and a floating-diffusion via may be substantially reduced, thereby reducing the coupling capacitance between them and thus increasing conversion gain. Further, BSI red response may be boosted by forming reflection layers by the extended transfer gate poly on top of PD.

According to one embodiment, an n-type doped region is formed in a semiconductor substrate, and a transfer gate is formed on the semiconductor substrate, therefore resulting in an overlap between one end of the transfer gate and the n-type doped region. A p-type doped region is then formed in the n-type doped region using the transfer gate as a mask.

According to another embodiment, an n-type doped region is formed in a semiconductor substrate, and a p-type doped region is formed in the n-type doped region. A transfer gate is then formed on the semiconductor substrate to substantially cover the n-type doped region and the p-type doped region.

DETAILED DESCRIPTION OF THE INVENTION

FIG. 3A to FIG. 3D show a sequence of cross sectional views that illustrates a process of forming a non-self aligned (non-SA) back side illumination (BSI) complementary metal oxide semiconductor (CMOS) image sensor (CIS) according to a first embodiment of the present invention. It is noted that only layers or regions that are pertinent to the feature or features of the embodiment are discussed or shown. In other words, there may be further layer(s) or region(s) disposed between, on, below or adjacent to the shown layers or regions.

Figure 3A:
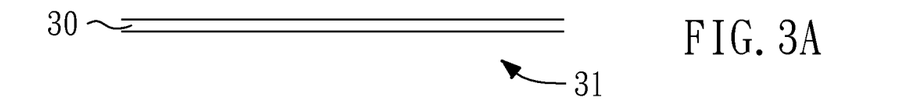
FIG. 3A to FIG. 3D show a sequence of cross sectional views that illustrates a process of forming a non-SA back side illumination (BSI) CIS according to a first embodiment of the present invention.
Figure 3B:
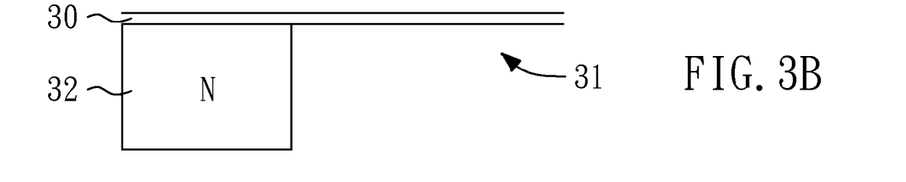
Figure 3C:
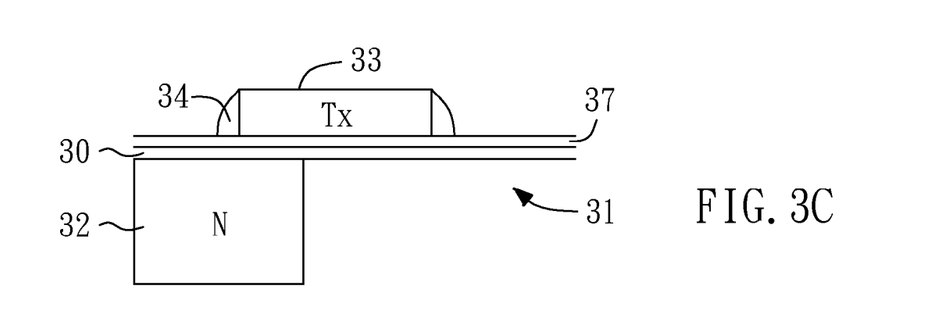
Figure 3D:
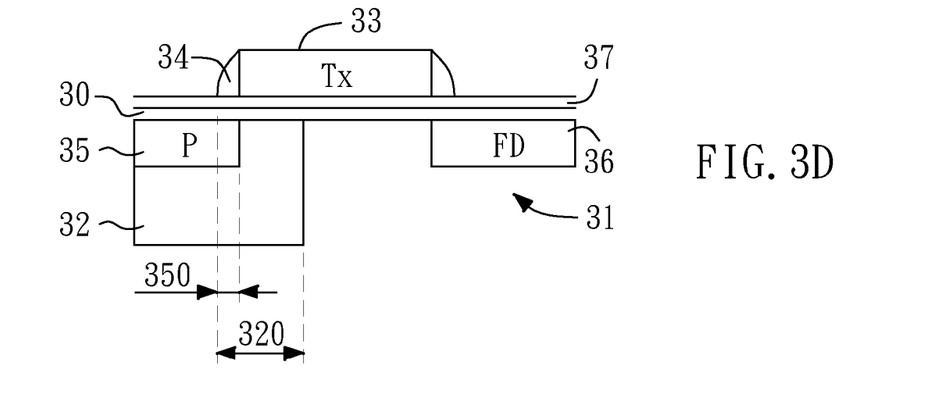

In FIG. 3A, all implants are within the top P type epitaxy portion of a semiconductor substrate 31 (e.g., a silicon substrate). A transfer gate (Tx) channel implant 30 such as p-type implant is formed in the semiconductor substrate 31. Subsequently, in FIG. 3B, an n-type doped region such as an n-type implant 32 is formed below the transfer gate channel implant 30. Next, in FIG. 3C, a thin gate oxide 37 is grown on the surface of substrate 31 and a transfer gate (Tx) 33 such as a polysilicon gate is formed on top of the gate oxide 37 such that an overlap exists between one end of the transfer gate 33 and the n-type implant 32. A spacer 34 such as silicon dioxide or silicon nitride may be further formed on a sidewall of the transfer gate 33. Afterwards, in FIG. 3D, a p-type doped region such as a p-type implant 35 is formed in the n-type implant 32 using the transfer gate 33 and the spacer 34 as a mask. In addition, a floating diffusion (FD) 36 is also formed in the substrate 31 near the other end of the transfer gate 33. The n-type implant 32 is disposed away from the floating diffusion 36. It is appreciated that some of the steps described above may be performed in an order other than that depicted in the figure. For example, the p-type implant 35 may be formed prior to the spacer 34 formation.

In the process described above, as the n-type implant 32 is non-self aligned with the transfer gate 33 and the back side of the substrate 31 receives incoming light, this type of CIS is thus called the non-SA back side illumination (BSI) CIS.

Figure 4A:
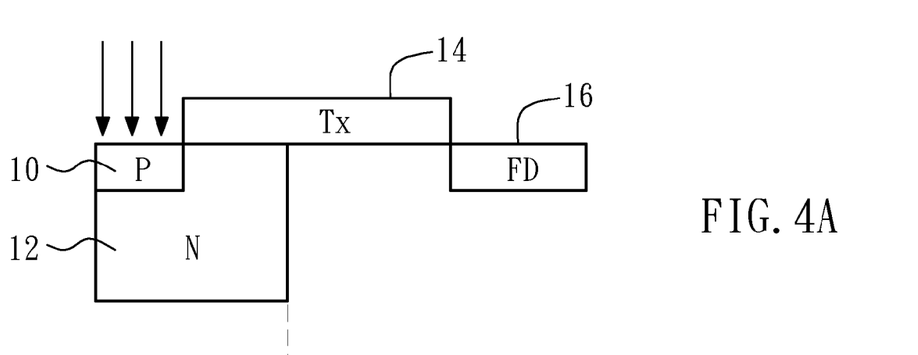
FIG. 4A shows a cross sectional view of a FSI CIS with extended transfer gate of the present invention.
Figure 4B:
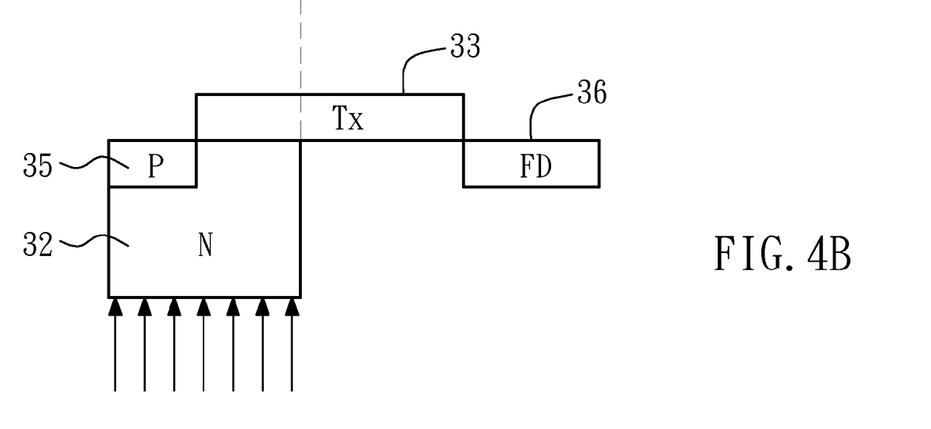
FIG. 4B shows a cross sectional view of a non-SA BSI CIS according to the first embodiment of the present invention.

According to the first embodiment, the incoming light is from the substrate backside, unlike the same structure on FSI in FIG. 2C (which is now reproduced in FIG. 4A), extended Tx Poly does not reduce the optical fill factor. Thanks to the extended Poly according to the present embodiment (FIG. 4B), more space on the top surface of the substrate 31 is available for obtaining large overlap 320 between the n-type implant 32 and the transfer gate 33, thereby improving charge transfer. In addition, overlap variation due to process misalignment becomes less significant. Moreover, the transfer gate 33 is less sensitive to the lateral diffusion 350 of the p-type implant 35 toward the transfer gate 33. This, therefore, provides more flexibility on p-type implant 35 and other implants optimizations.

FIG. 5A to FIG. 5D show a sequence of cross sectional views that illustrates a process of forming a non-self aligned (non-SA) BSI CIS according to a second embodiment of the present invention. In the second embodiment, both the n-type implant 32 and the p-type implant 35 are non-self aligned (non-SA) with the transfer gate 33, while, in the first embodiment, only the n-type implant 32 is non-self aligned (non-SA) with the transfer gate 33.

Figure 5A:
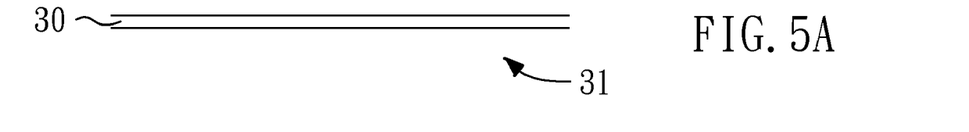
FIG. 5A to FIG. 5D show a sequence of cross sectional views that illustrates a process of forming a non-SA BSI CIS according to a second embodiment of the present invention.
Figure 5B:
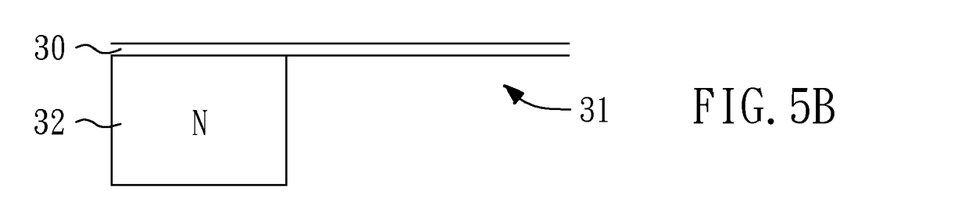
Figure 5C:
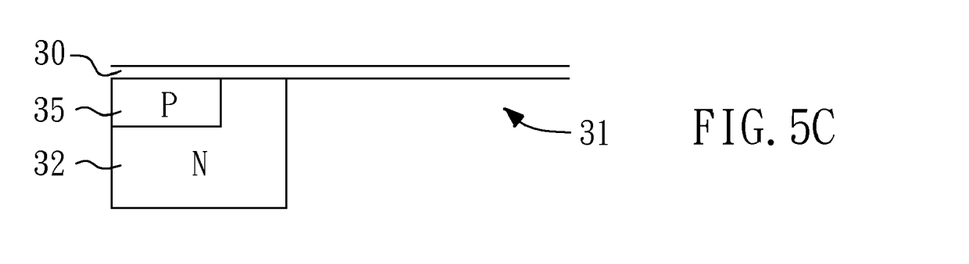
Figure 5D:
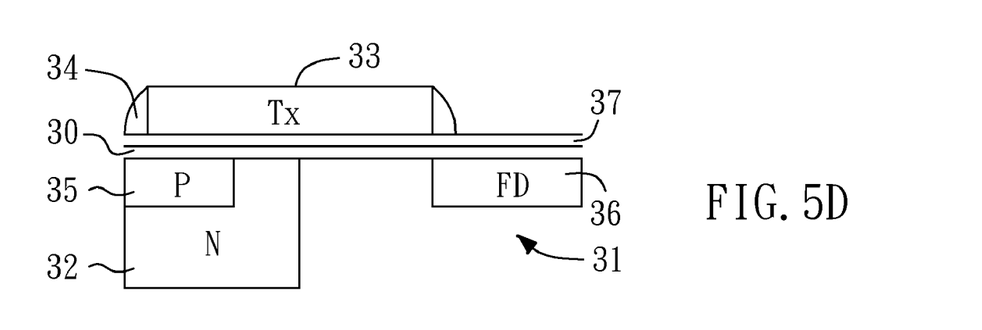

In FIG. 5A, all implants are within the top P type epitaxy portion of a semiconductor substrate 31 (e.g., a silicon substrate). A transfer gate (Tx) channel implant 30 such as p-type implant is formed in a semiconductor substrate 31. Subsequently, in FIG. 5B, an n-type doped region such as an n-type implant 32 is formed below the transfer gate channel implant 30. Next, in FIG. 5C, a p-type doped region such as a p-type implant 35 is formed in the n-type implant 32. Accordingly, at the surface region of the substrate 31, sufficient distance is created between the n-type implant 32 and the p-type implant 35. Afterwards, in FIG. 5D, a thin gate oxide 37 is grown on the surface of substrate 31 and then a transfer gate (Tx) 33 such as a polysilicon gate is formed on top of the gate oxide 37 such that an overlap exists between the transfer gate 33 and the n-type implant 32. Further, the transfer gate 33 is extended to substantially (e.g., more than 95%) cover the photodiode (i.e., the p-type implant 35 and the n-type implant 32). A spacer 34 such as silicon dioxide or silicon nitride may be further formed on a sidewall of the transfer gate 33. In addition, a floating diffusion (FD) 36 is also formed in the substrate 31.

The second embodiment maintains the advantages of the first embodiment. In addition, as the extended transfer gate 33 covers the photodiode (32 and 35) area in the second embodiment, hole accumulation with off transfer gate 33 not only occurs at the surface of substrate 31 between the photodiode (32 and 35) and the floating diffusion 36, but also occurs over the p-type implant 35, thereby further reducing surface dark current.

Figure 6A:
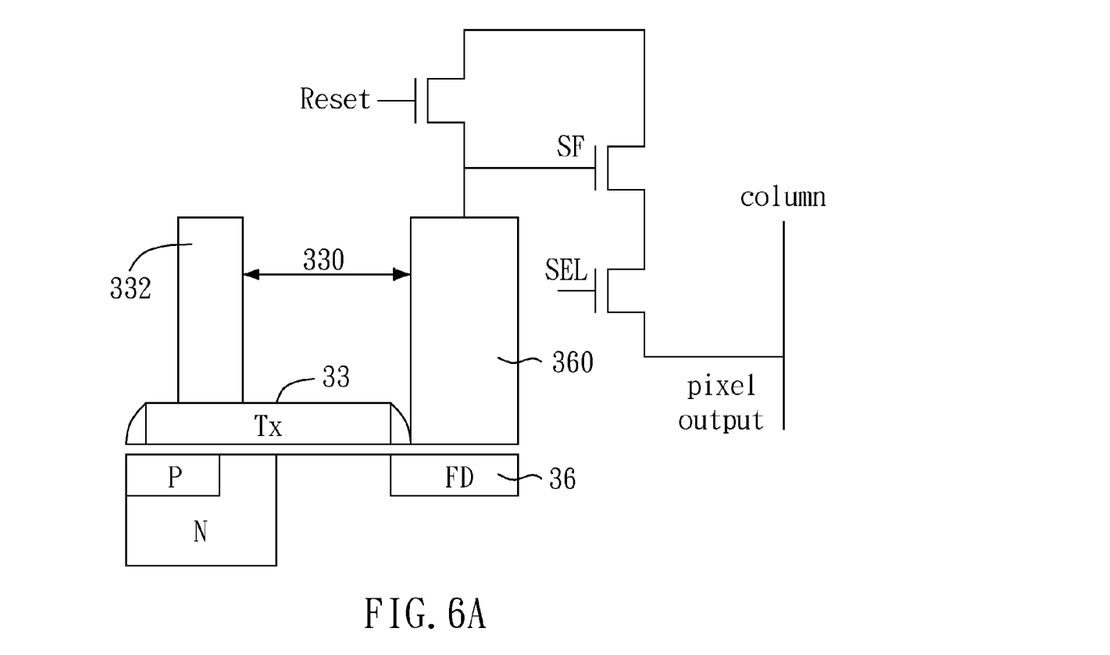
FIG. 6A shows a cross sectional view of the non-SA BSI CIS with extended transfer gate along with circuit schematic of a portion of the pixel circuit in the advanced 3D CIS technology of the present invention.
Figure 6B:
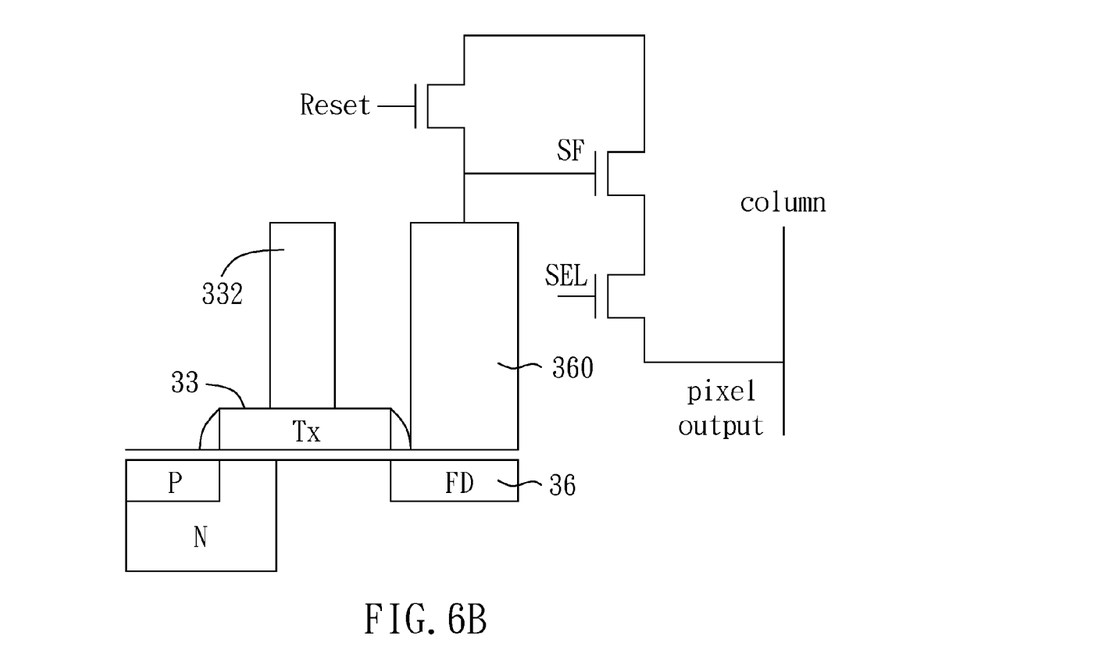
FIG. 6B shows a cross sectional view and circuit schematic of a counterpart of FIG. 6A without extended transfer gate.

Moreover, the non-SA BSI CSI second embodiment can also benefit the burgeoning 3D CIS technology. It is shown in FIG. 6A a cross sectional view of the non-SA BSI CIS with extended transfer gate 33 at the pixel photo diode level along with circuit schematic of a portion of the pixel circuit (e.g., a reset transistor, a source follower SF and a select transistor SEL) at the pixel circuit level and two 3D vias 360 and 332 at FD 36 and Tx 33 respectively bridging the PD and Circuit levels in the vertical direction (the added $3^{rd}$ dimension vs. the conventional 2D topology of Integrated Circuit). FIG. 6B shows a cross sectional view and circuit schematic of a counterpart without extended transfer gate. It is observed that the distance 330 between a transfer-gate 3D via 332 and a FD 3D via 360 may be substantially increased (compared to that shown in FIG. 6B), thereby reducing the coupling capacitance between them and thus increasing conversion gain.

Figure 7:
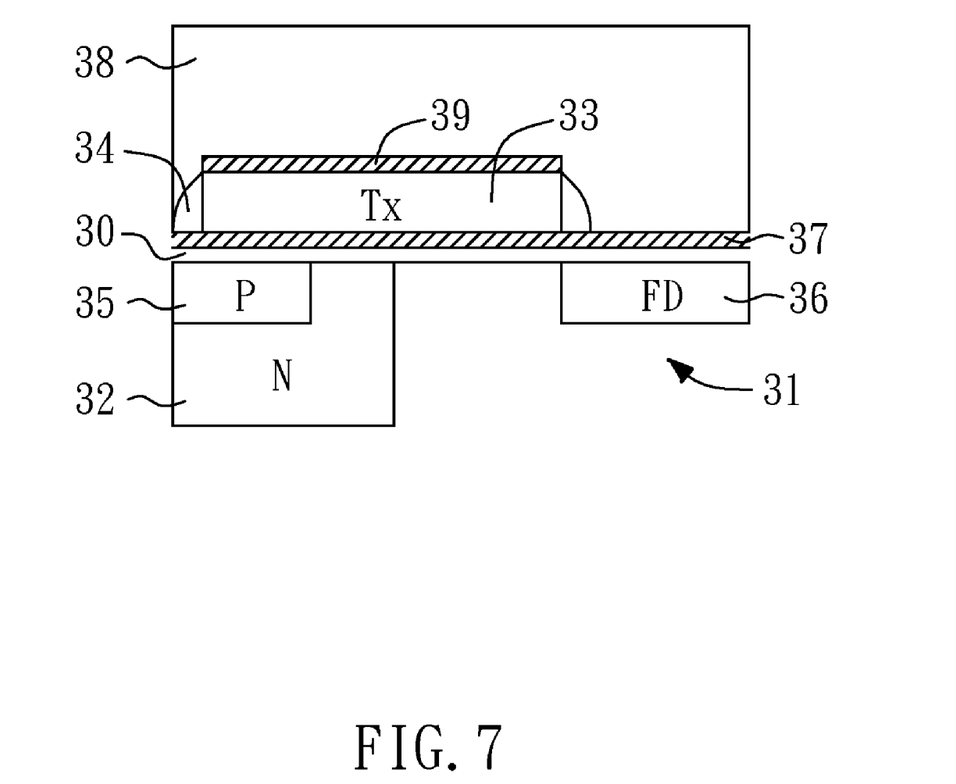
FIG. 7 shows a cross sectional view of the non-SA BSI CIS with extended transfer gate 33 according to one embodiment of the present invention.

The non-SA BSI CIS second embodiment also improves CIS optical performance. FIG. 7 shows a cross sectional view of the non-SA BSI CIS with extended transfer gate 33 according to the second embodiment in FIG. 5D of the present invention. As described earlier in the process, a gate oxide layer 37 is formed between the surface of the substrate 31 and the transfer gate 33. Also in the standard CMOS process, an inter-metal-dielectric (IMD) layer 38 is formed over the transfer gate 33 and the oxide layer 37. In the embodiment, the optical indices of the substrate 31, the oxide layer 37, the transfer gate 33 and the IMD layer 38 are chosen such that (1) the optical index of the substrate 31 (e.g., Si) is higher than the optical index of the oxide layer 37, thereby forming a first interface with index contrast; (2) the optical index of the transfer gate 33 (e.g., Poly Si) is higher than the optical index of the oxide layer 37, thereby forming a second interface with index contrast; (3) the optical index of the transfer gate 33 is higher than the optical index of the IMD layer 38, thereby forming a third interface with index contrast. In one example, the IMD layer 38 includes porous material that has even lower optical index. These three interfaces may produce more reflection of light, especially long wavelength red light back to the photodiode (32 and 35), thereby boosting red response. According to another embodiment, still referring to FIG. 7, a silicide reflector layer 39 is further formed between the transfer gate 33 and the IMD layer 38 to further boost red response.

Although specific embodiments have been illustrated and described, it will be appreciated by those skilled in the art that various modifications may be made without departing from the scope of the present invention, which is intended to be limited solely by the appended claims.

What is claimed is:

1. A process of forming a back side illumination (BSI) image sensor, comprising:
    forming an n-type doped region in a semiconductor substrate;
    forming a p-type doped region in the n-type doped region;
    forming a transfer gate on the semiconductor substrate to substantially cover the n-type doped region and the p-type doped region;
    forming an oxide layer between the semiconductor substrate and the transfer gate; and
    forming an inter-metal-dielectric (IMD) layer over the transfer gate and the oxide layer;
    wherein an optical index of the semiconductor substrate is higher than an optical index of the oxide layer, an optical index of the transfer gate is higher than an optical index of the oxide layer and an optical index of the transfer gate is higher than an optical index of the IMD layer.

2. The process of claim 1, wherein the n-type doped region is an n-type implant, and the p-type doped region is a p-type implant.

3. The process of claim 1, wherein the transfer gate is a polysilicon gate.

4. The process of claim 1, further comprising a step of forming a floating diffusion in the semiconductor substrate, the floating diffusion being disposed away from the n-type doped region.

5. The process of claim 1, further comprising a step of forming a silicide reflector layer between the transfer gate and the IMD layer.

6. A back side illumination (BSI) image sensor, comprising:
    a semiconductor substrate;
    an n-type doped region formed in the semiconductor substrate;
    a p-type doped region formed in the n-type doped region;
    a transfer gate formed on the semiconductor substrate, the transfer gate substantially covering the n-type doped region and the p-type doped region;
    an oxide layer formed between the semiconductor substrate and the transfer gate; and
    an inter-metal-dielectric (IMD) layer formed to over the transfer gate and the oxide layer;
    wherein an optical index of the semiconductor substrate is higher than an optical index of the oxide layer, an optical index of the transfer gate is higher than an optical index of the oxide layer, and an optical index of the transfer gate is higher than an optical index of the IMD layer.

7. The image sensor of claim 6, further comprising a transfer gate channel implant formed between a surface of the semiconductor substrate and top surfaces of the n-type doped region and the p-type doped region.

8. The image sensor of claim 6, wherein the n-type doped region is an n-type implant, and the p-type doped region is a p-type implant.

9. The image sensor of claim 6, wherein the transfer gate is a polysilicon gate.

10. The image sensor of claim 6, further comprising a spacer formed on a sidewall of the transfer gate.

11. The image sensor of claim 6, further comprising a floating diffusion formed in the semiconductor substrate, the floating diffusion being disposed away from the n-type doped region.

12. The image sensor of claim 6, further comprising a silicide reflector layer formed between the transfer gate and the IMD layer.

* * * * *